(12) United States Patent
Chen et al.

(10) Patent No.: US 8,035,782 B2
(45) Date of Patent: Oct. 11, 2011

(54) TRANSFLECTIVE LIQUID CRYSTAL DISPLAY PANEL

(75) Inventors: Yu-Cheng Chen, Hsin-Chu (TW); Tun-Chun Yang, Hsin-Chu (TW)

(73) Assignee: AU Optronics Corp., Science-Based Industrial Park, Hsin-Chu (TW)

( * ) Notice: Subject to any disclaimer, the term of this patent is extended or adjusted under 35 U.S.C. 154(b) by 189 days.

(21) Appl. No.: 12/332,347

(22) Filed: Dec. 11, 2008

(65) Prior Publication Data

US 2009/0279028 A1   Nov. 12, 2009

(30) Foreign Application Priority Data

May 12, 2008   (TW) ................................ 97117452 A

(51) Int. Cl.
*G02F 1/1335* (2006.01)
(52) U.S. Cl. .......................................... 349/114; 349/47
(58) Field of Classification Search .................. None
See application file for complete search history.

(56) References Cited

U.S. PATENT DOCUMENTS

| | | | |
|---|---|---|---|
| 6,459,463 B2 | 10/2002 | Kim | |
| 7,206,047 B2 * | 4/2007 | Hwang | ........................ 349/114 |
| 7,532,263 B2 | 5/2009 | Lee | |
| 2004/0012738 A1 | 1/2004 | Murai et al. | |
| 2005/0140869 A1 | 6/2005 | Yang | |
| 2009/0115949 A1 * | 5/2009 | Yang et al. | ..................... 349/114 |

FOREIGN PATENT DOCUMENTS

| | | |
|---|---|---|
| CN | 1460879 A | 12/2003 |
| CN | 1567422 A | 1/2005 |
| CN | 101030587 A | 9/2007 |

* cited by examiner

*Primary Examiner* — Thanh-Nhan Nguyen
(74) *Attorney, Agent, or Firm* — Winston Hsu; Scott Margo

(57) ABSTRACT

A transflective LCD panel includes a substrate, a first polycrystalline silicon pattern disposed in a reflection region, a second polycrystalline silicon pattern disposed in a peripheral region, an insulating layer disposed on the first and second polycrystalline silicon pattern and the substrate, a gate electrode disposed on the insulating layer in the reflection region, a storage capacitor line disposed on the insulating layer in the peripheral region, a first inter-layer dielectric disposed on the insulating layer, the gate electrode and the storage capacitor line, a reflection electrode disposed on the first inter-layer dielectric, a second inter-layer dielectric disposed on the first inter-layer dielectric and the reflection electrode, and a transmission electrode disposed on the second inter-layer dielectric and electrically connected to the reflection electrode through an opening of the second inter-layer dielectric. The second polycrystalline silicon pattern, the storage capacitor line, and the insulating layer disposed therebetween form a storage capacitor.

9 Claims, 22 Drawing Sheets

TRANSFLECTIVE LIQUID CRYSTAL DISPLAY PANEL

BACKGROUND OF THE INVENTION

1. Field of the Invention

The present invention relates to a transflective liquid crystal display panel and method of making the same, and more particularly, to a transflective liquid crystal display panel with high aperture ratio, and a method of making the same with simplified process steps.

2. Description of the Prior Art

Liquid crystal display (LCD), based on different light sources, may be classified into three types including: transmission type, reflection type and transflective type. The transmission LCD requires a back light module, which is disposed behind the LCD panel and able to generate light beams passing the LCD panel so that the user can see images in front of the transmission LCD. The reflective LCD uses ambient light as its light source, and requires forming reflection electrodes in each pixel. The ambient light enters the reflective LCD from its front side (observation screen) and is reflected by the reflection electrodes so that the user can see images from the front side of the reflective LCD. The transflective LCD includes both transmission mode and reflection mode. Each pixel includes a transmission region which uses back light source, and a reflection region which uses ambient light as its light source.

Please refer to FIG. 1. FIG. 1 schematically illustrates a conventional transflective LCD. As shown in FIG. 1, the conventional LCD includes a substrate 10 having reflection regions 12 and transmission regions 14 defined thereon. Each reflection region 12 includes a thin film transistor (TFT) formed therein. The TFT comprises a semiconductor layer including a channel 16, a source electrode 18, a drain electrode 20 and two lightly doped drains (LDDs) 21, a gate insulating layer 22, and a gate electrode 24. The source electrode 18 and the drain electrode 20 are disposed on two opposite side of the channel 16 respectively. One of the LDD 21 is disposed between the source electrode 18 and the channel 16, and the other LDD 21 is between the drain electrode 20 and the channel 16. The gate insulating layer 22 is disposed on the channel 16, the source electrode 18 and the drain electrode 20. The gate electrode 24 is disposed on the gate insulating layer 22 and corresponding to the channel 16.

The gate insulating layer 22 and the gate electrode 24 are covered with a first inter-layer dielectric layer 26. The first inter-layer dielectric layer 26 and the gate insulating layer 22 disposed beneath have two openings respective exposing the source electrode 18 and the drain electrode 20. A data line 28 and a drain pad 30 are disposed on the first inter-layer dielectric layer 26. The data line 28 fills into the opening over the source electrode 18 so as to electrically connect to the source electrode 18; the drain pad 30 fills into the opening over the drain electrode 20 so as to electrically connect to the drain electrode 20. In the reflection region 12, the first inter-layer dielectric layer 26, the data line 28 and the drain pad 30 are covered with a second inter-layer dielectric layer 32. The second inter-layer dielectric layer 32 has an opening exposing the drain pad 30. The second inter-layer dielectric layer 30 and the first inter-layer dielectric layer 26 are covered with a transmission electrode 34, where the transmission electrode 34 is electrically connected to the drain pad 30 and the drain electrode 20 via the opening of the second inter-layer dielectric layer 32. The transmission electrode 34 also extends to the transmission region 14. In addition, a reflection electrode 36 is disposed on the transmission electrode 34 in the reflection region 12, and the reflection electrode 36 is electrically connected to the drain electrode 20 through the transmission electrode 34 and the drain pad 30.

The conventional transflective LCD, however, suffers from the following drawbacks. First, the conventional transflective LCD has to be fabricated by at least eight photolithographic processes to define the semiconductor layer, the source electrode/drain electrode, the LDD, the gate electrode, the first inter-layer dielectric layer, the data line/drain pad, the second inter-layer dielectric layer, the transmission electrode/reflection electrode respectively, and the process step is therefore complicated. In addition, the second inter-layer dielectric layer is formed in the reflection region but not in the transmission region, which generates a height gap between the reflection region and the transmission region. This height gap increases the difficulty in rubbing the alignment patterns, controlling the cell gap, and arranging the spacers in successive liquid crystal process.

SUMMARY OF THE INVENTION

It is therefore one of the objectives of the present invention to provide a transflective LCD panel and method of making the same to simplify the structure and process step of a transflective LCD panel.

According to the present invention, a transflective LCD panel is provided. The transflective LCD panel includes a substrate, a polycrystalline silicon layer, an insulating layer, a first metal layer, a first inter-layer dielectric layer, a second metal layer, a second inter-layer, and a transmission electrode. The substrate includes a reflection region, a transmission region and a peripheral region. The polycrystalline silicon layer is disposed on the substrate, and the polycrystalline silicon layer includes a first polycrystalline silicon pattern disposed in the reflection region, and a second polycrystalline silicon pattern disposed in the peripheral region, wherein the first polycrystalline silicon pattern includes a channel, and a source electrode and a drain electrode respectively disposed on two opposite sides of the channel. The insulating layer is disposed on the polycrystalline silicon layer and the substrate. The first metal layer is disposed on the insulating layer, and the first metal layer includes a gate electrode corresponding to the channel, a storage capacitor line corresponding to the second polycrystalline silicon pattern, wherein the second polycrystalline silicon pattern, the storage capacitor line, and the insulating layer disposed therebetween form a storage capacitor. The first inter-layer dielectric layer is disposed on the insulating layer and the first metal layer, and the first inter-layer dielectric layer has two openings exposing the source electrode and the drain electrode respectively. The second metal layer is disposed on the first inter-layer dielectric layer, and the second metal layer includes a reflection electrode and a data line, wherein the reflection electrode is disposed in the reflection region and electrically connected to the drain electrode via the opening of the first inter-layer dielectric layer corresponding to the drain electrode, the data line is disposed in the peripheral region, extended to the reflection region, and electrically connected to the source electrode via the opening of the first inter-layer dielectric layer corresponding to the source electrode. The second inter-layer dielectric layer is disposed on the first inter-layer dielectric layer and the second metal layer, and the second inter-layer dielectric layer has an opening partially exposing the second metal layer. The transmission electrode is disposed on the second inter-layer dielectric layer, wherein the transmission electrode is disposed in the transmission region, extended to a border region between the reflection region and the transmission region, and electrically connected to the drain electrode via the opening of the second inter-layer dielectric layer.

According to the present invention, a method of forming a transflective LCD panel is provided. The method includes the following steps. A substrate is provided, and a reflection region, a transmission region, and a peripheral region are defined in the substrate. A polycrystalline silicon layer is formed on the substrate, and a first photolithographic process is performed to form a first polycrystalline silicon pattern in the reflection region, and a second polycrystalline silicon pattern in the peripheral region. A second photolithographic process is performed to form a channel in the first polycrystalline silicon pattern, and a source electrode and a drain electrode on two opposite sides of the channel. An insulating layer is formed on the first polycrystalline silicon pattern, the second polycrystalline silicon pattern, and the substrate. A first metal layer is formed on the insulating layer, and a third photolithographic process is performed to form a gate electrode corresponding to the channel in the reflection region, and a storage capacitor line corresponding to the second polycrystalline silicon pattern in the peripheral region, wherein the channel, the source electrode, the drain electrode, the insulating layer and the gate electrode form a thin film transistor, and the second polycrystalline silicon pattern, the storage capacitor line, and the insulating layer disposed therebetween form a storage capacitor. A first inter-layer dielectric layer is formed on the insulating layer and the first metal layer, and performing a fourth photolithographic process to form two openings respectively exposing the source electrode and the drain electrode in the first inter-layer dielectric layer. A second metal layer is formed on the first inter-layer dielectric layer, and a fifth photolithographic process is performed to form a reflection electrode in the reflection region, and a data line in the peripheral region and extending to the reflection region, wherein the reflection electrode is electrically connected to the drain electrode via the opening of the first inter-layer dielectric layer corresponding to the drain electrode, and the data line is electrically connected to the source electrode via the opening of the first inter-layer dielectric layer corresponding to the source electrode. A second inter-layer dielectric layer is formed on the first inter-layer dielectric layer and the second metal layer, and a sixth photolithographic process is formed to form an opening partially exposing the second metal layer in the second inter-layer dielectric layer. A transparent conductive layer is formed on the second inter-layer dielectric layer, and a seventh photolithographic process is performed to form a transmission electrode, wherein the transmission electrode is disposed in the transmission region and extended to a border region between the reflection region and the transmission region, and the transmission electrode is electrically connected to the reflection electrode and the drain electrode via the opening of the second inter-layer dielectric layer.

The method of the present invention simplifies process steps, and therefore only requires seven photolithographic processes to from a transflective LCD panel. In addition, the reflection electrode is disposed over the TFT, which increases the area of the reflection region. Also, the aperture ratio is improved since the storage capacitor is formed beneath the data line.

These and other objectives of the present invention will no doubt become obvious to those of ordinary skill in the art after reading the following detailed description of the preferred embodiment that is illustrated in the various figures and drawings.

DETAILED DESCRIPTION

Figure 1:
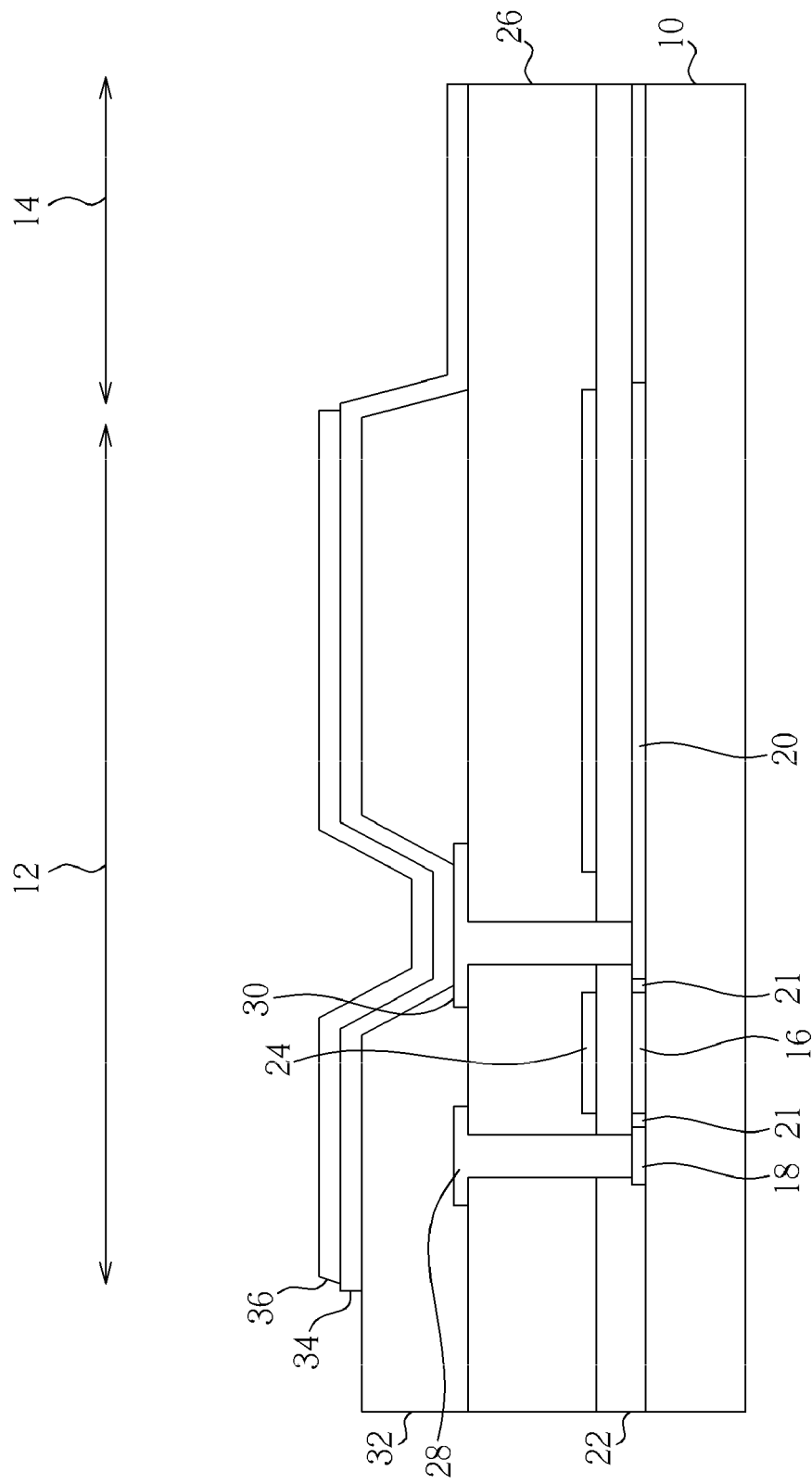
FIG. 1 schematically illustrates a conventional transflective LCD.
Figure 2:
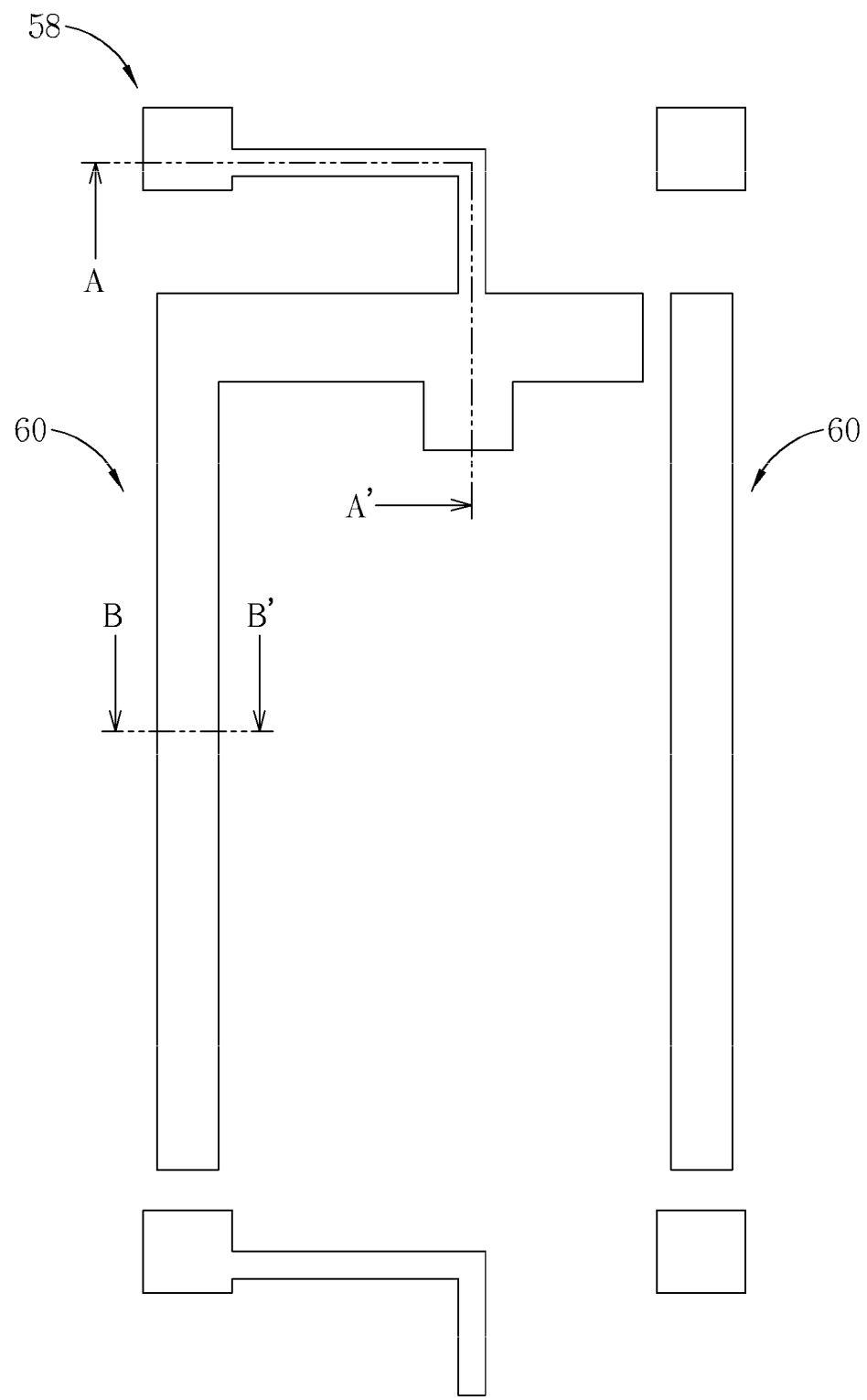
FIGS. 2-17 schematically illustrate a method of forming a transflective LCD panel according to a preferred embodiment of the present invention.
Figure 3:
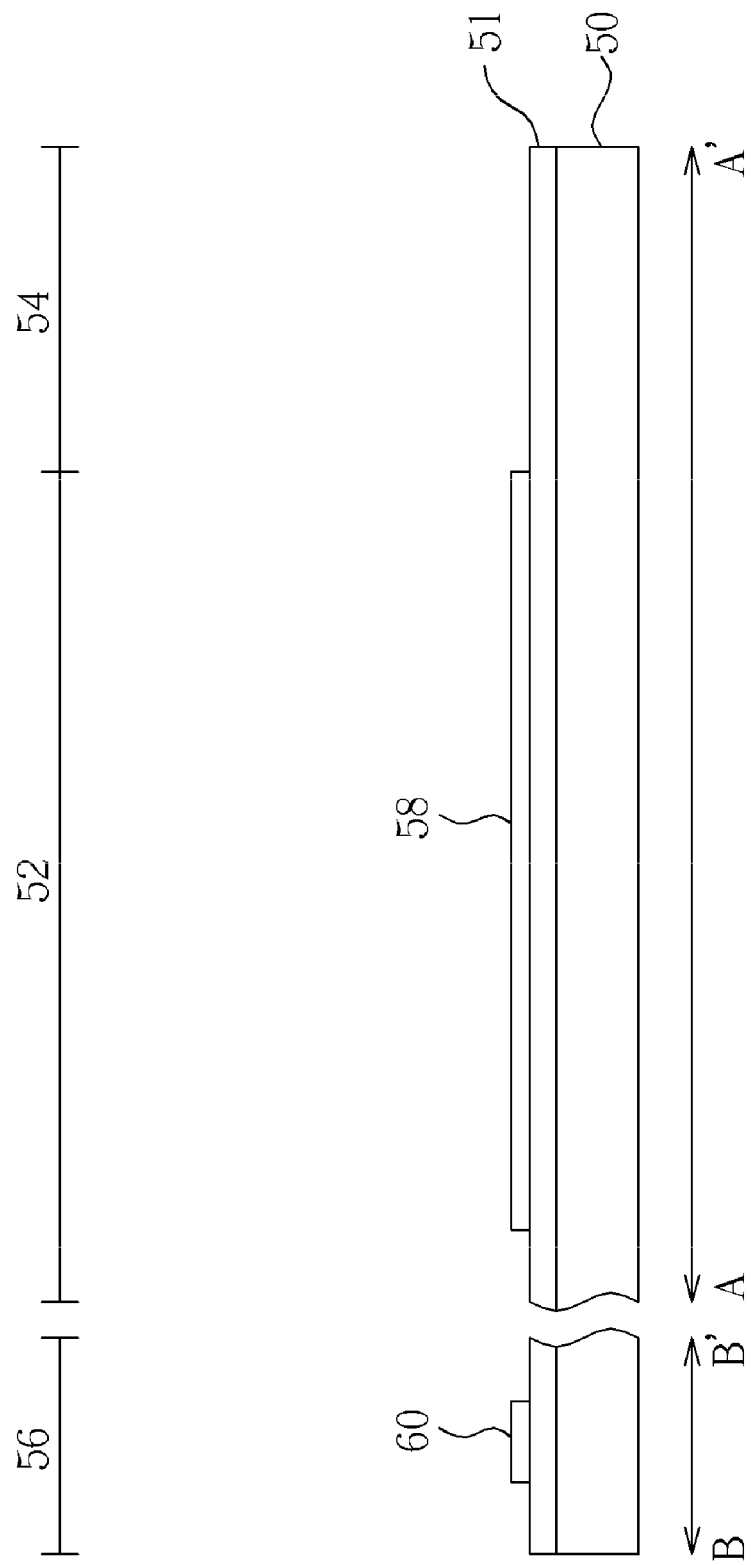

Please refer to FIGS. 2-17. FIGS. 2-17 schematically illustrate a method of forming a transflective LCD panel according to a preferred embodiment of the present invention. In the drawings, only a single pixel is shown to demonstrate the method of the present invention. FIGS. 2, 4, 6, 8, 10, 12, 14 and 16 are top views, and FIGS. 3, 5, 7, 9, 11, 13, 15 and 17 are cross-sectional views along lines A-A' and B-B'. As shown in FIGS. 2 and 3, a substrate 50 is provided, and a reflection region 52, a transmission region 54 and a peripheral region 56 are defined in the substrate 50, where the peripheral region 56 is disposed aside the reflection region 52 and the transmission region 54. A buffer layer 51 (not shown in FIG. 2) may be alternatively formed on the substrate 50. Subsequently, a polycrystalline silicon layer e.g. a low temperature polycrystalline silicon layer is formed on the substrate 50, and a first photolithographic process is performed accompanied with an etching process to form a first polycrystalline silicon pattern 58 in the reflection region 52, and a second polycrystalline silicon pattern 60 in the peripheral region 56. The first polycrystalline silicon pattern 58 is used as a semiconductor layer of a TFT, and the second polycrystalline silicon pattern 60 is used as a bottom electrode of a storage capacitor. In this embodiment, the first polycrystalline silicon pattern 58 and the second polycrystalline silicon pattern 60 are electrically connected together, but not limited.

Figure 4:
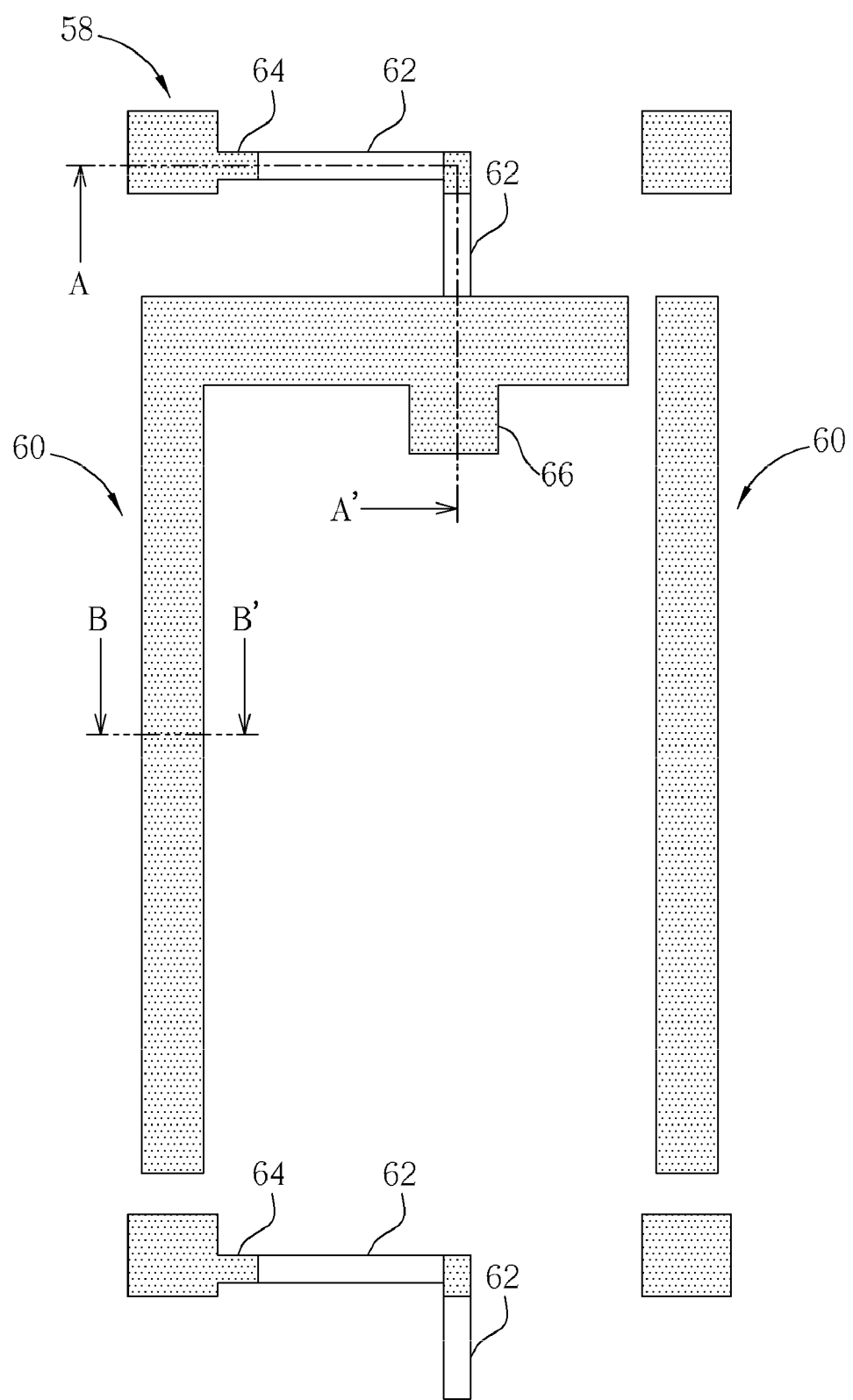
Figure 5:
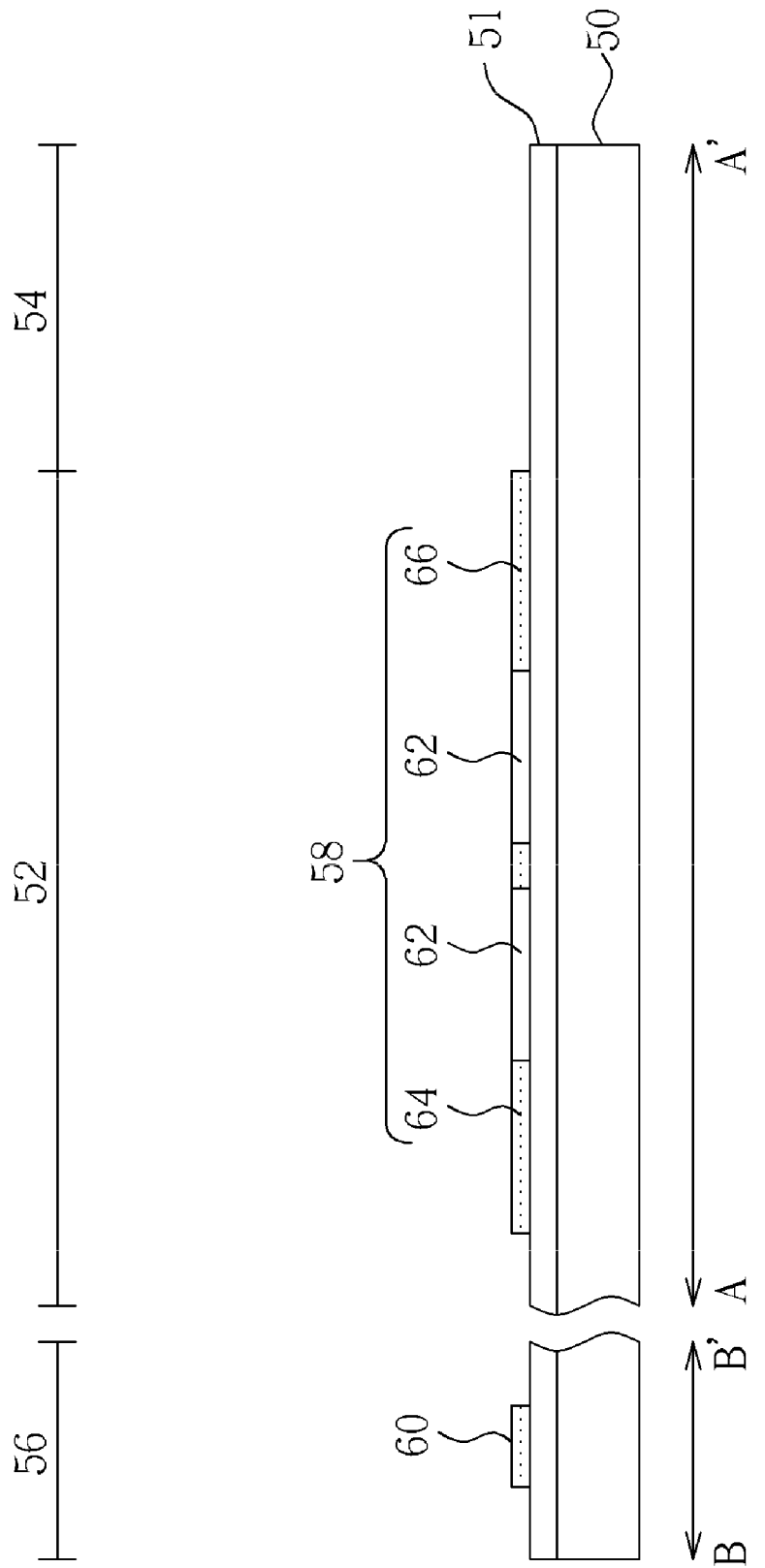

As shown in FIGS. 4 and 5, a second photolithographic process is performed accompanied with a high dosage implantation process to dope the first polycrystalline silicon pattern 58 and the second polycrystalline silicon pattern 60. In the second photolithographic process, a portion of the first polycrystalline silicon pattern 58 is blocked by a mask pattern (not shown) and therefore not doped, so that the undoped region of the first polycrystalline silicon pattern 58 forms a channel 62 and the doped regions disposed on two opposite sides of the channel 62 form a source electrode 64 and a drain electrode 66. The doped second polycrystalline silicon pattern 60 becomes conductive, thereby forming a bottom electrode of a storage capacitor. In this embodiment, the dopants of the high dosage implantation process may be P type or N type. The TFT of this embodiment has dual-gate design, and thus the channel 62 has a layout as shown in FIG. 4. The design of the TFT, however, is not limited, and may be a single-gate TFT, for instance.

Figure 6:
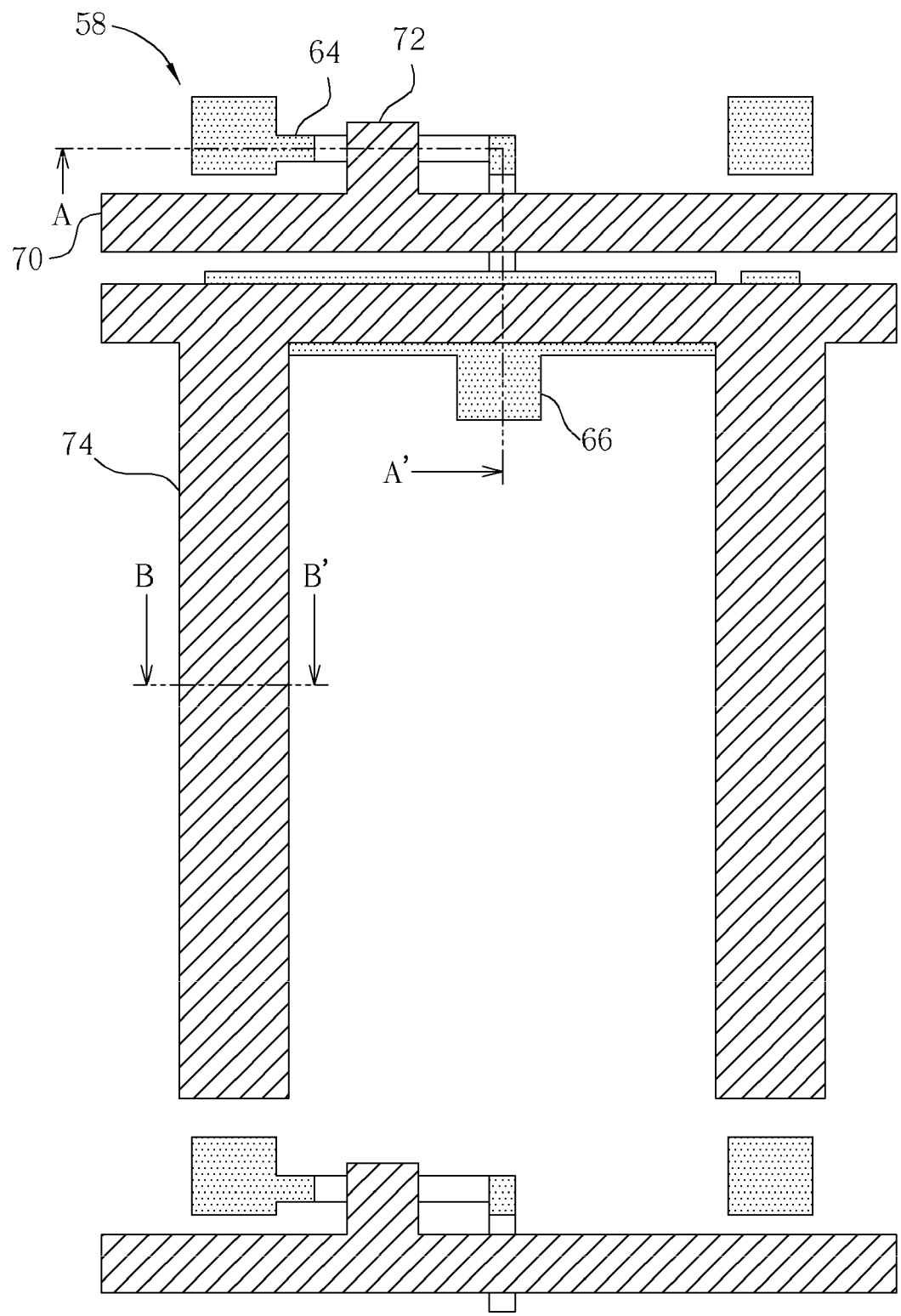
Figure 7:
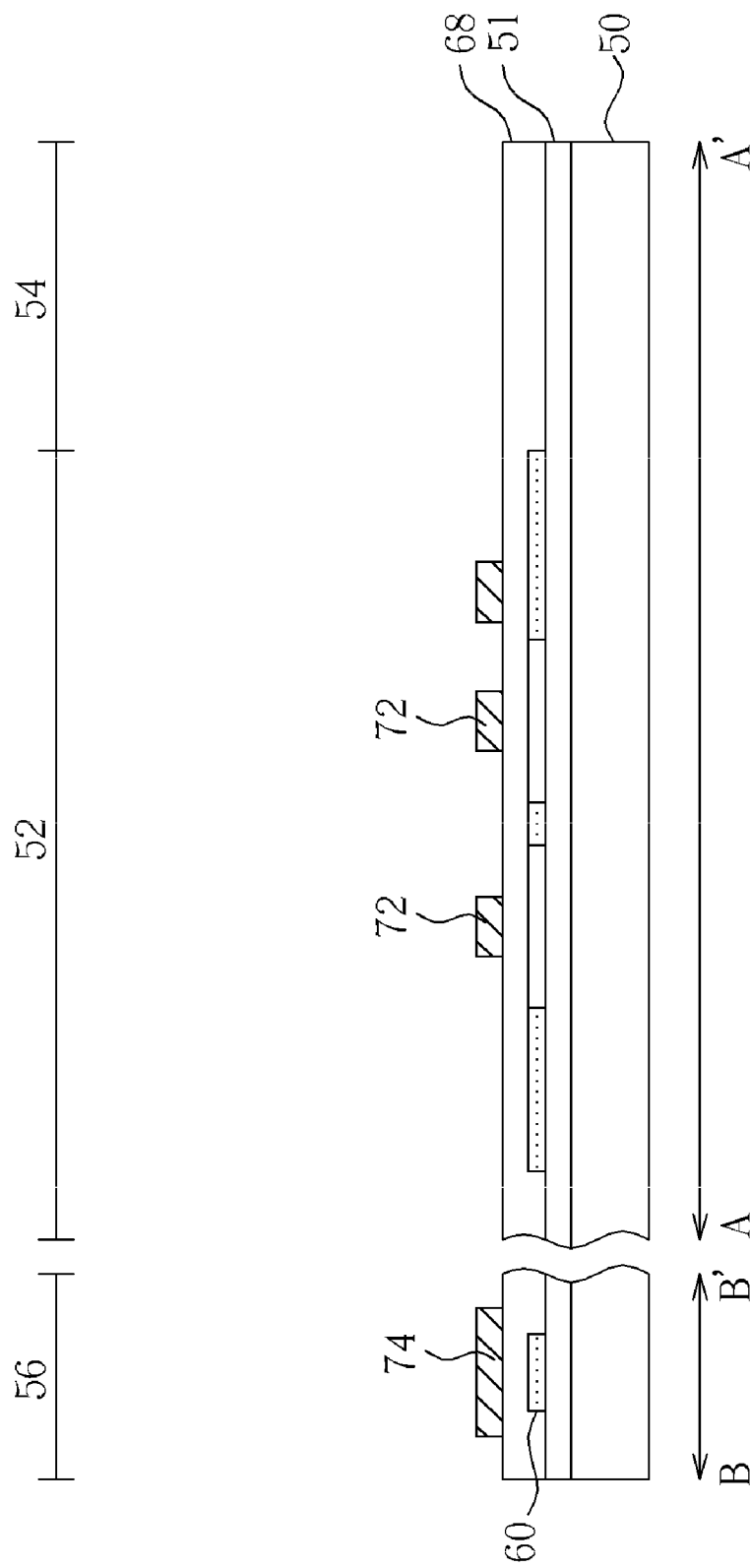

As shown in FIGS. 6 and 7, an insulating layer 68 (not shown in FIG. 6) is formed on the first polycrystalline silicon pattern 58, the second polycrystalline silicon pattern 60 and the substrate 50, where the insulating layer 68 corresponding to the channel 62 serves as a gate insulating layer. It is appreciated that the step of forming the channel 62, the source electrode 64 and the drain electrode 66 in the first polycrystalline silicon pattern 58 is not limited to be implemented prior to the step of forming the insulating layer 68 on the first polycrystalline silicon pattern 58, the second polycrystalline silicon pattern 60 and the substrate 50. In other words, the channel 62, the source electrode 64 and the drain electrode 66 may be formed in the first polycrystalline silicon pattern 58 subsequent to forming the insulating layer 68 on the first polycrystalline silicon pattern 58, the second polycrystalline silicon pattern 60, and the substrate 50. Subsequently, a first metal layer is formed on the insulating layer 68, and a third photolithographic process is performed accompanied with an etching process to form a scan line 70 and a gate electrode 72 electrically connected to the scan line 70 and corresponding to the channel 62 in the reflection region 52, and a storage capacitor line 74 corresponding to the second polycrystalline silicon pattern 60 in the peripheral region 56. The storage capacitor line 74 is used as a top electrode of the storage capacitor, and therefore the second polycrystalline silicon pattern 60, the storage capacitor line 74, and the insulating layer 68 disposed between the second polycrystalline silicon pattern 60 and the storage capacitor line 74 in the peripheral region 56 form the storage capacitor.

Figure 8:
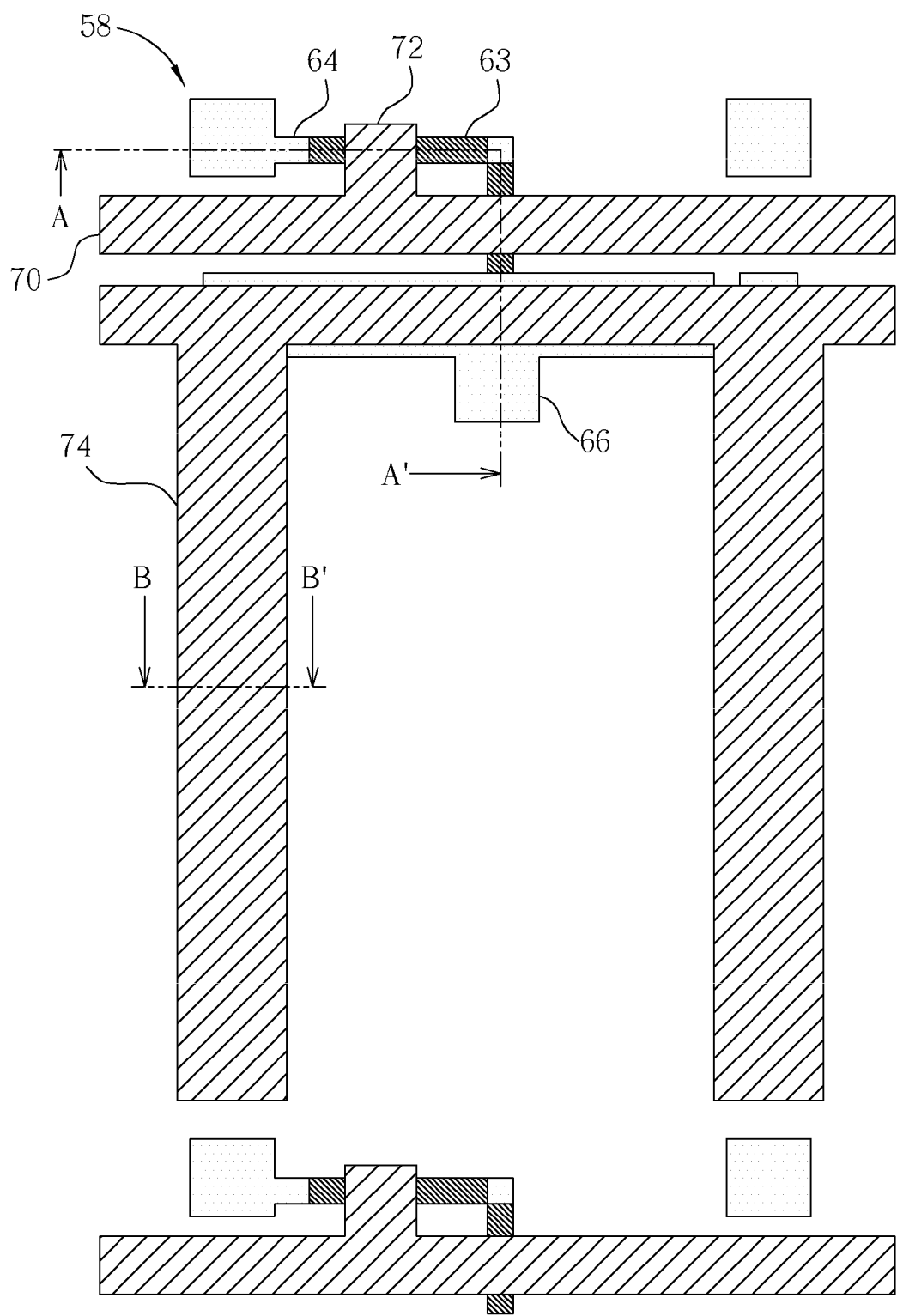
Figure 9:
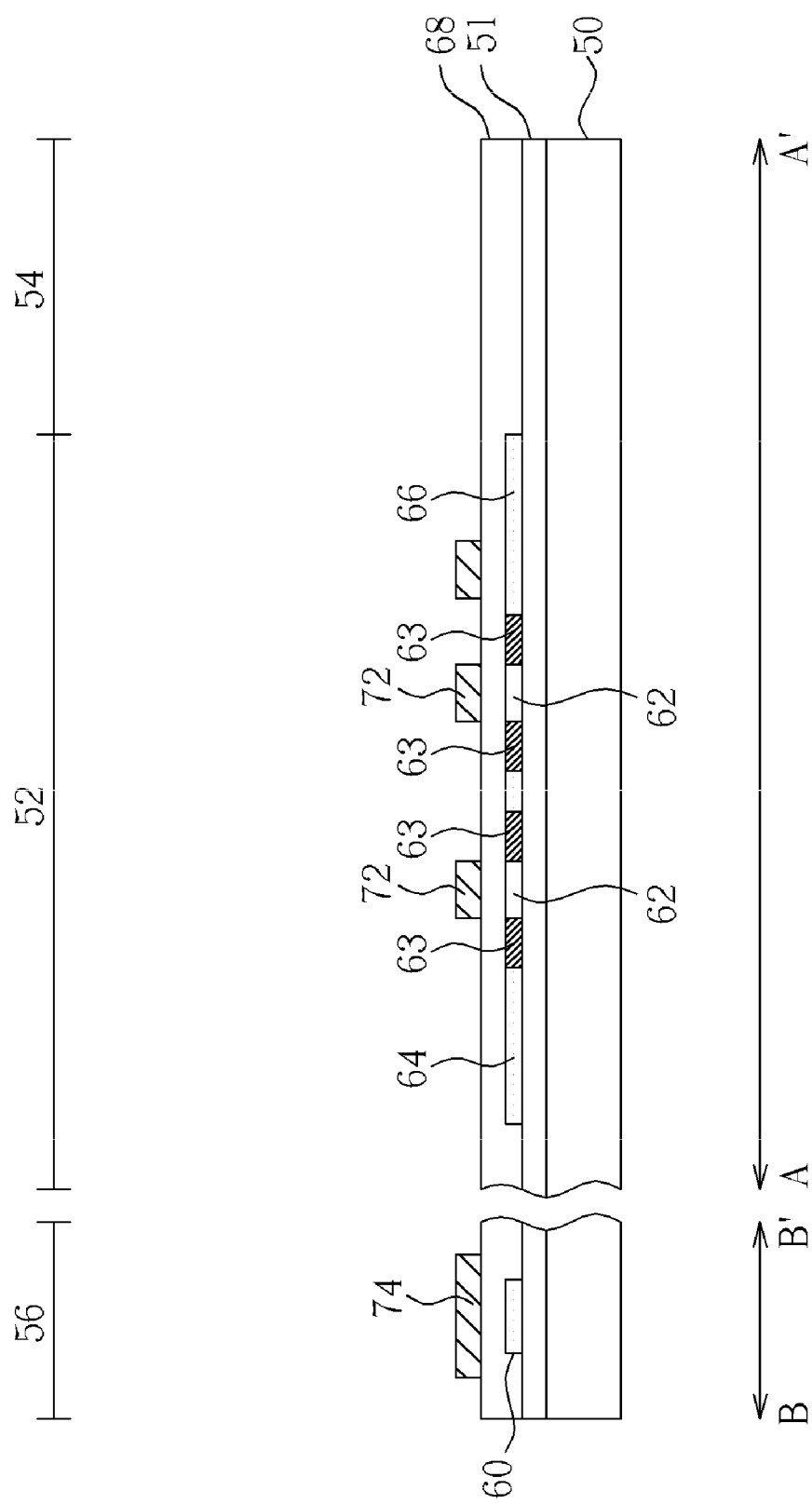

As shown in FIGS. 8 and 9, a low dosage implantation process is performed to form two LDDs 63 in the first polycrystalline silicon pattern 58. In this embodiment, the dimension of the gate electrode 72 is smaller than the channel 62, and therefore the LDDs 63 can be formed alongside the channel 62 using the gate electrode 72 as a mask without requiring additional mask.

Figure 10:
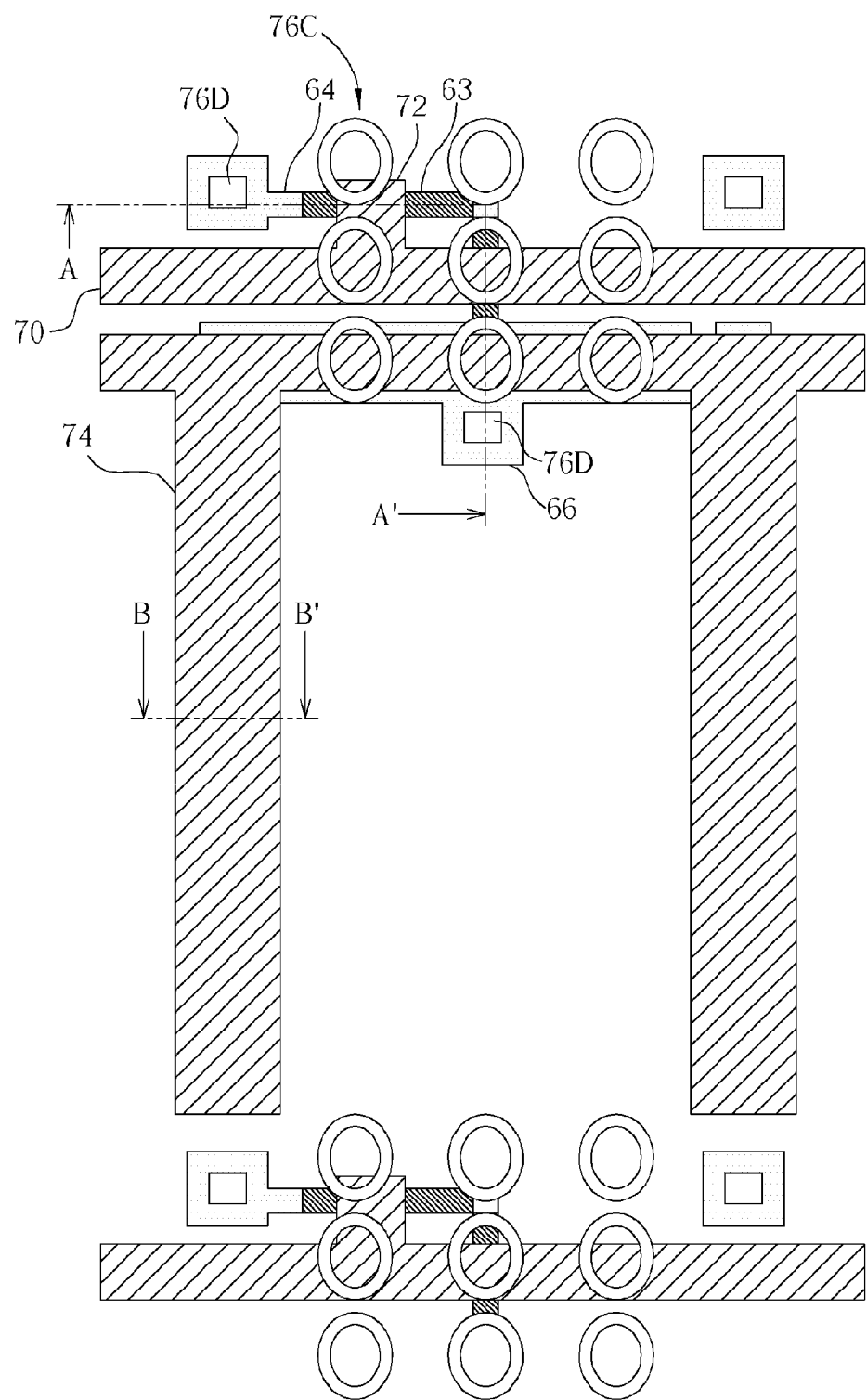
Figure 11:
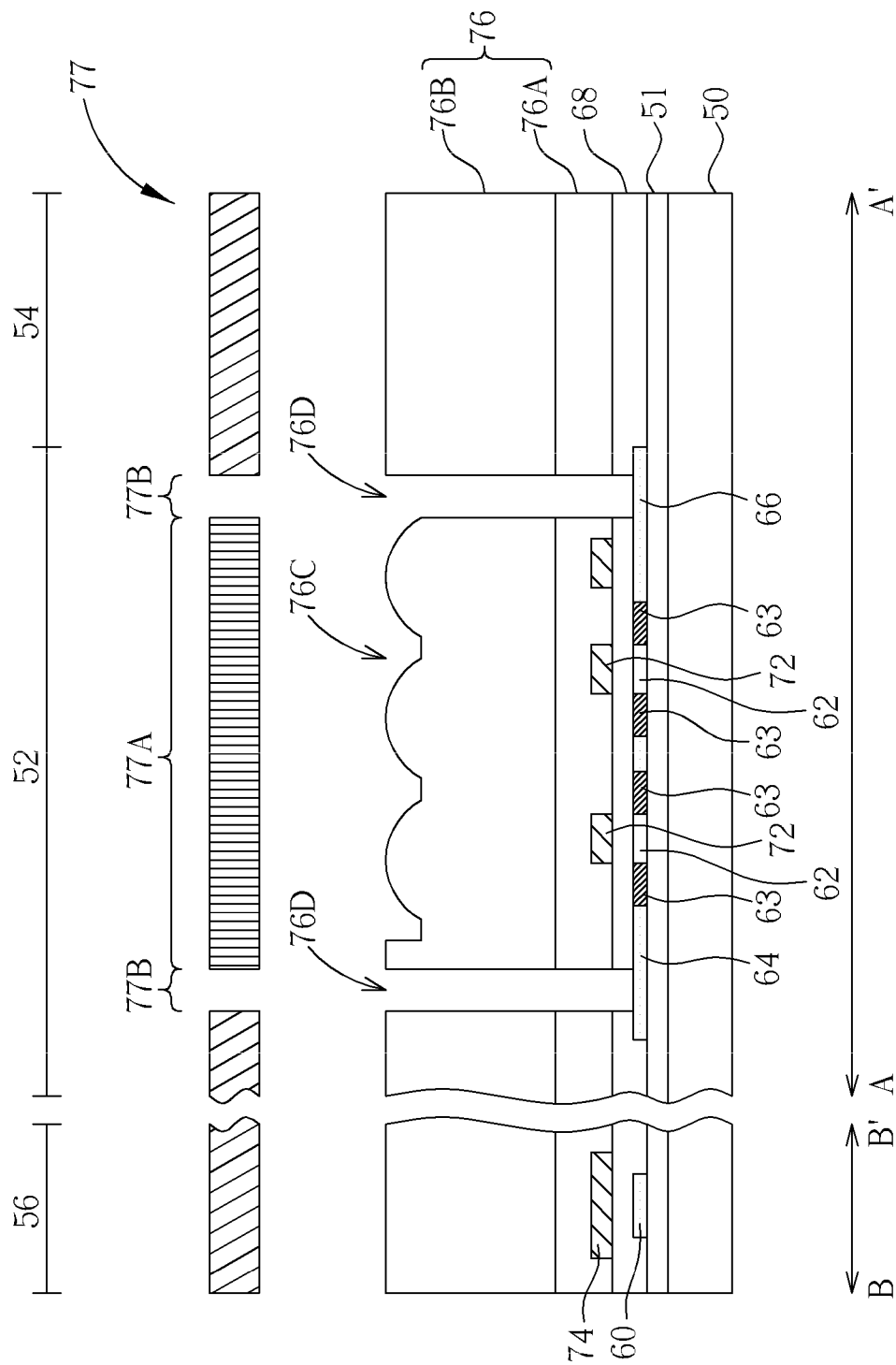

As shown in FIGS. 10 and 11, a first inter-layer dielectric layer 76 (not shown in FIG. 10) is formed on the insulating layer 68 and the first metal layer. Then, the surface of the first inter-layer dielectric layer 76 is roughened to form a rough surface 76C, and two openings 76D through the first inter-layer dielectric layer 76 and the insulating layer 68 are formed to partially expose the source electrode 64 and the drain electrode 66. In this embodiment, the first inter-layer dielectric layer 76 may include an inorganic dielectric layer 76A e.g. a silicon nitride layer, and a photosensitive organic dielectric layer 76B. In this embodiment, the rough surface 76C of the first inter-layer dielectric layer 76 and the openings 76D are formed by a performing fourth photolithographic process using a halftone photomask 77 and an etching process. The fourth photolithographic process uses the halftone photomask 77 to control light exposure. A translucent region 77A of the halftone photomask 77 corresponds to the region of the photosensitive organic dielectric layer 76B where the rough surface 76C to be formed, and a transparent region 77B corresponds to the region where the openings 76D to be formed. Since the light exposure of the translucent region 77A is less, the rough surface 76C is formed in the surface of the photosensitive organic dielectric layer 76B after exposing and developing; the light exposure of the transparent region 77B is more, and thus the exposed photosensitive organic dielectric layer 76B is removed to form two openings 76D are formed. An etching process is then performed to etch the inorganic dielectric layer 76A and the insulating layer 68 through the openings 76D to expose the source electrode 64 and the drain electrode 66.

In this embodiment, the halftone photomask 77 is used to form the rough surface 76C and the openings 76D of the first inter-layer dielectric layer 76, but the rough surface 76C and the openings 76D may be formed in other manners. For instance, the rough surface 76C and the openings 76D may be formed with two different photomasks, or the rough surface 76C may be formed by a laser process.

Figure 12:
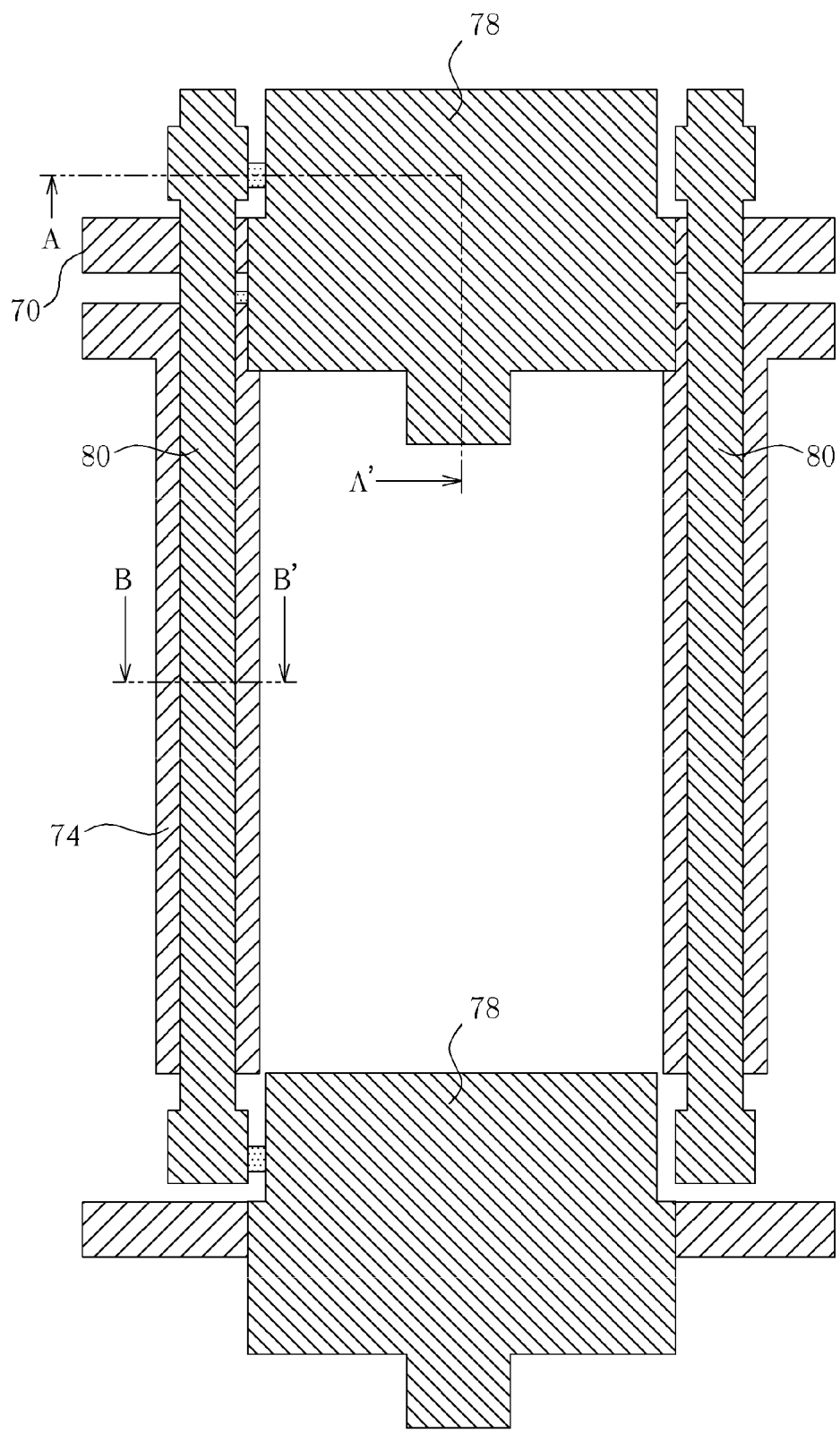
Figure 13:
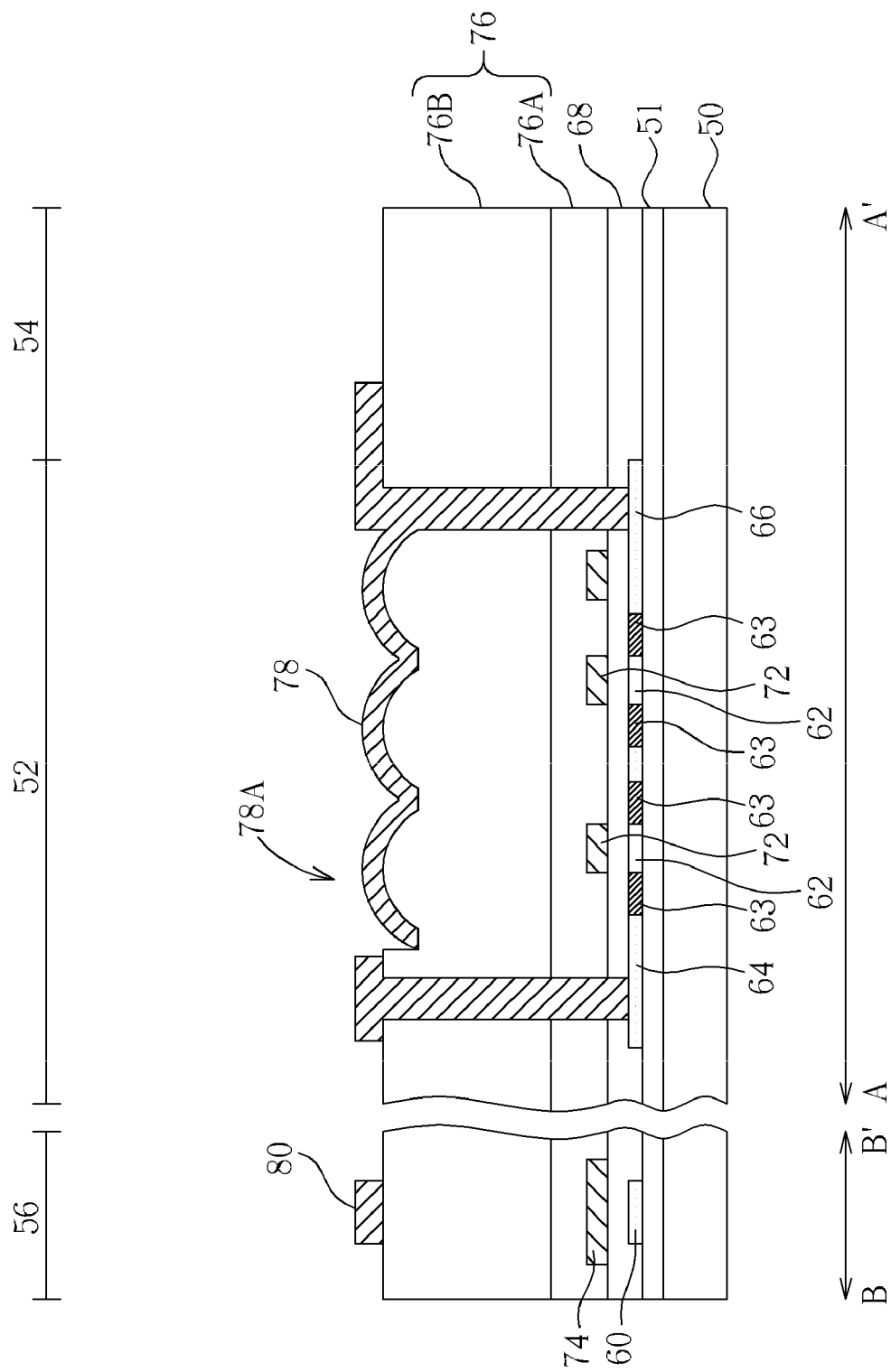

As shown in FIGS. 12 and 13, a second metal layer (not shown) is formed on the first inter-layer dielectric layer 76, and a fifth photolithographic process is performed accompanied with an etching process to form a reflection electrode 78 in the reflection region 52, and a data line 80 extending from the peripheral region 56 to the reflection region 52. The reflection electrode 78 is electrically connected to the drain electrode 66 through the opening 76D of the first inter-layer dielectric layer 76 corresponding to the drain electrode 66, and the data line 80 is electrically connected to the source electrode 64 through the opening 76D of the first inter-layer dielectric layer 76 corresponding to the source electrode 64. The reflection electrode 78 has a rough surface 78A because the first inter-layer dielectric layer 76 disposed beneath the reflection electrode 78 has a rough surface 76C. The rough surface 78A can concentrate the reflected light beams, so as to improve reflectivity.

Figure 14:
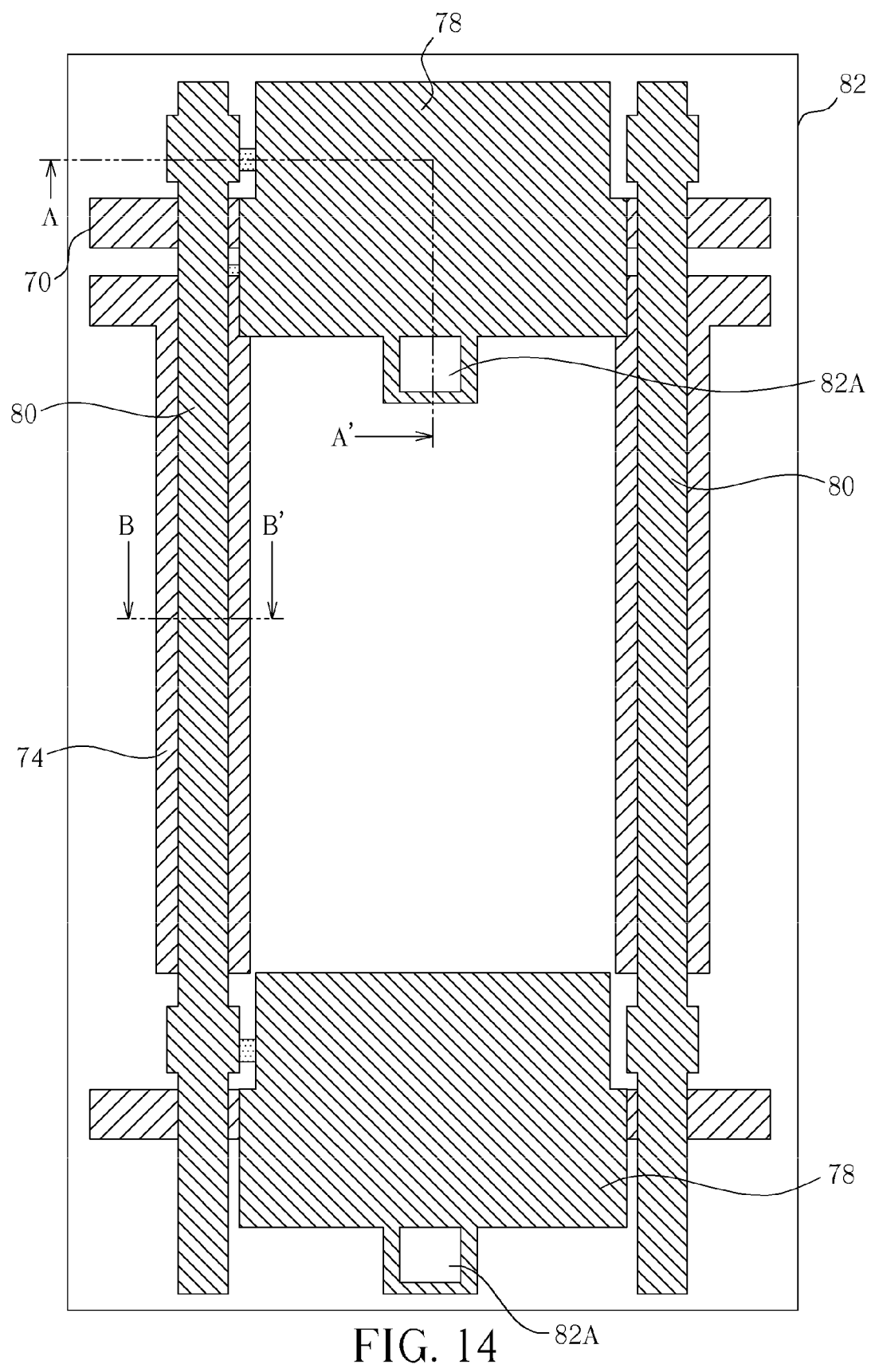
Figure 15:
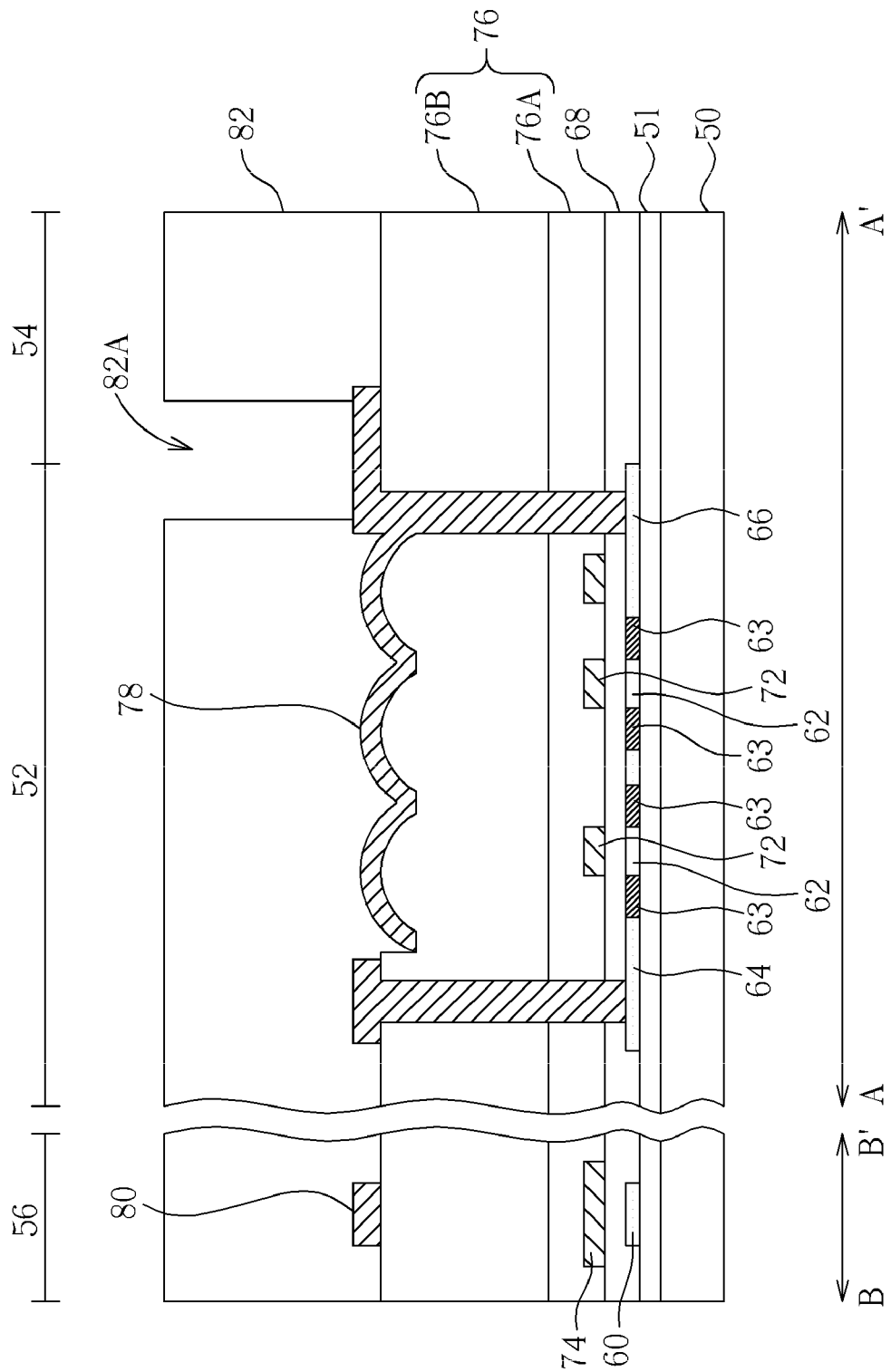
Figure 16:
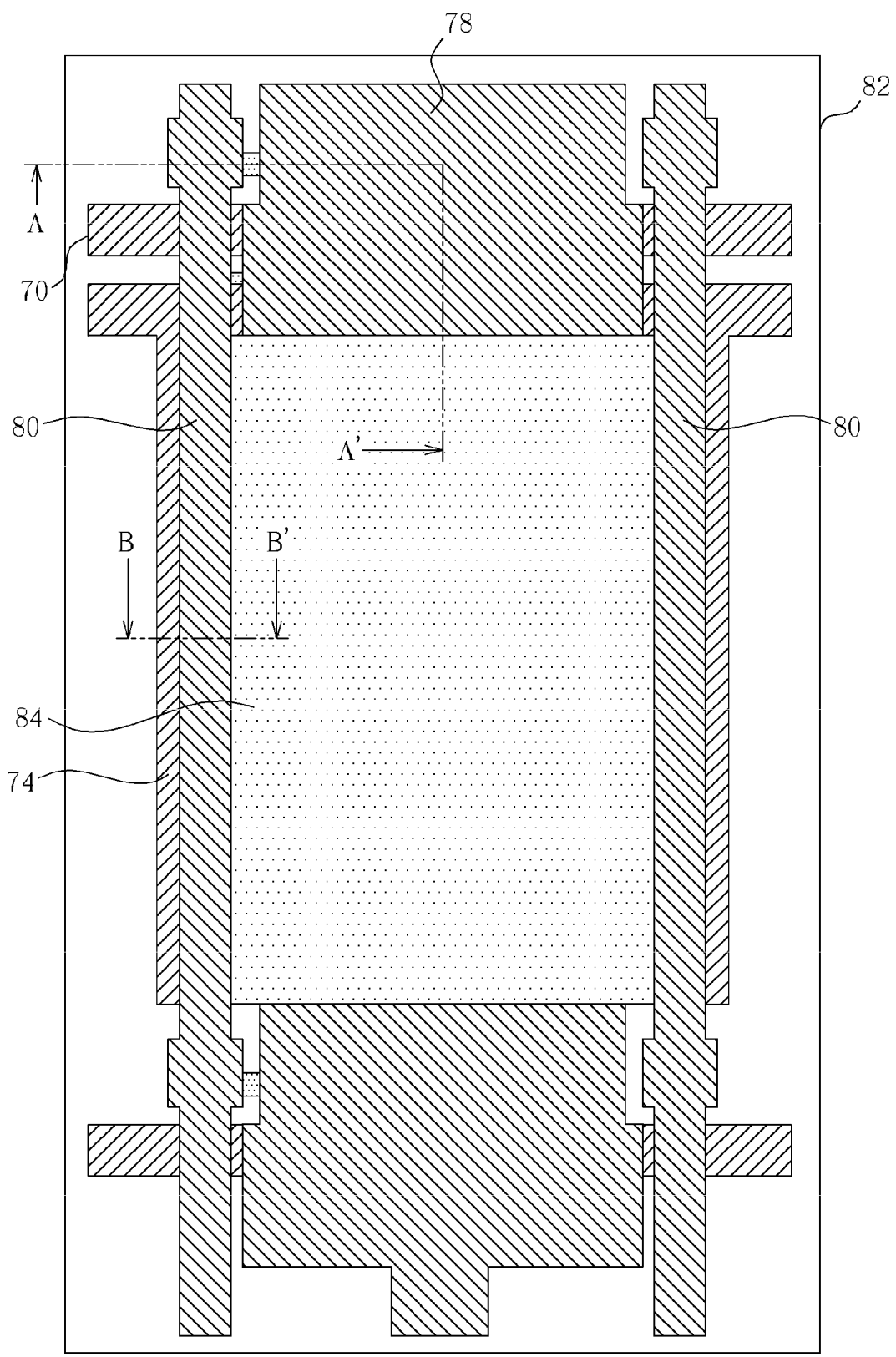
Figure 17:
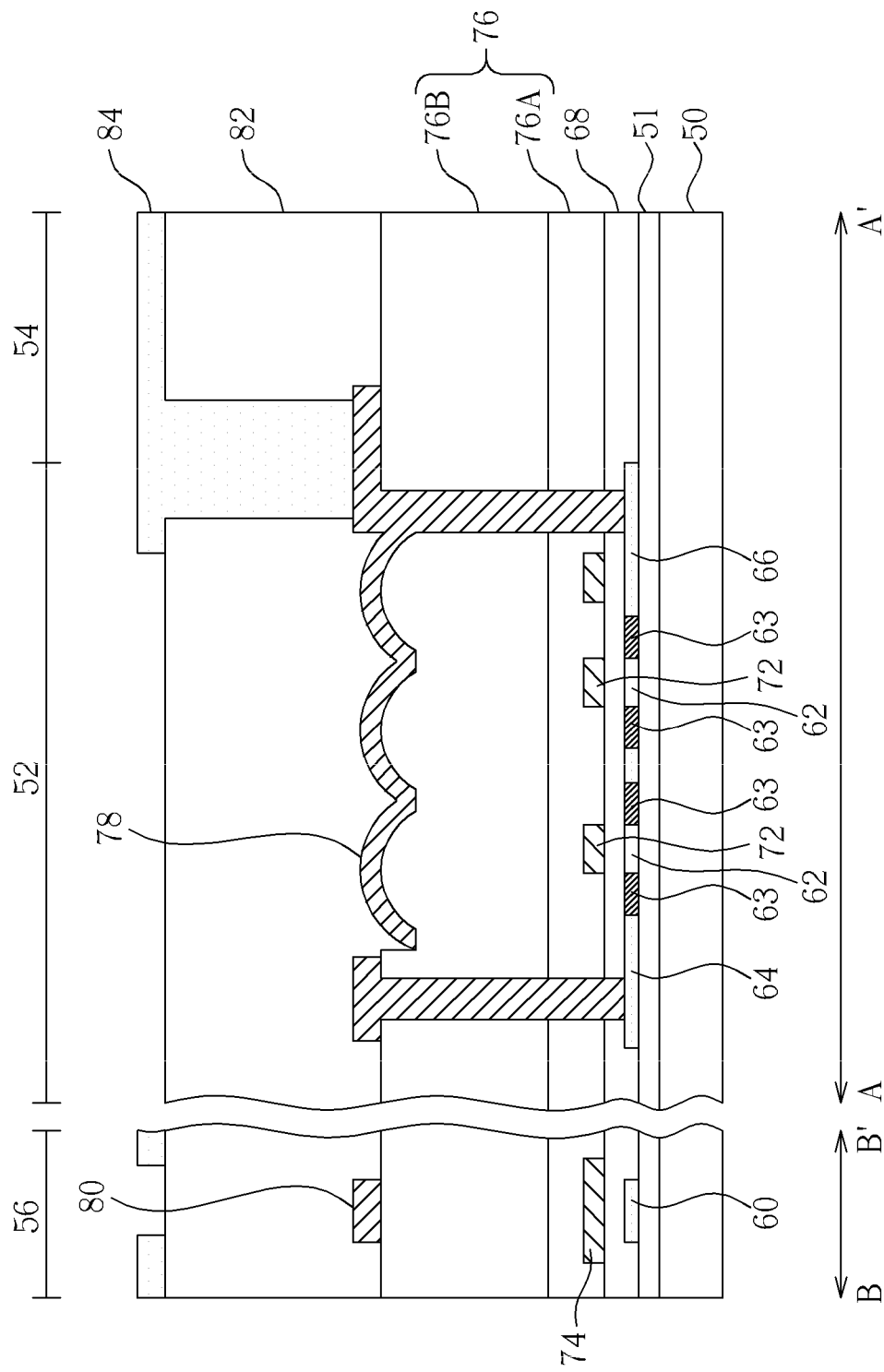

As shown in FIGS. 14 and 15, a second inter-layer dielectric layer 82 is formed on the first inter-layer dielectric layer 76 and the second metal layer, and a sixth photolithographic process is performed accompanied with an etching process to form an opening 82A in the second inter-layer dielectric layer 82 to partially expose the second metal layer (the edge of the reflection electrode 78). As shown in FIGS. 16 and 17, a transparent conductive layer (not shown) is formed on the second inter-layer dielectric layer 82, and a seventh photolithographic process is performed accompanied with an etching process to form a transmission electrode 84. The transmission electrode 84 is disposed in the transmission region 54, and extending to the border region between the reflection region 52 and the transmission region 54 such that the transmission electrode 84 can electrically connected to the reflection electrode 78 and the drain electrode 66 via the opening 82A of the second inter-layer dielectric layer 82. In this embodiment, the edge of the transmission electrode 84 and the edge of the data line 80 are substantially aligned and not overlapping with each other (as shown in FIGS. 16 and 17), so as to prevent parasitic capacitor. The transmission electrode 84 and the data line 80, however, may not be aligned and may not be overlapping for instance. The relative positions of the transmission electrode 84 and the data line 80 may be changed, and not limited.

Figure 18:
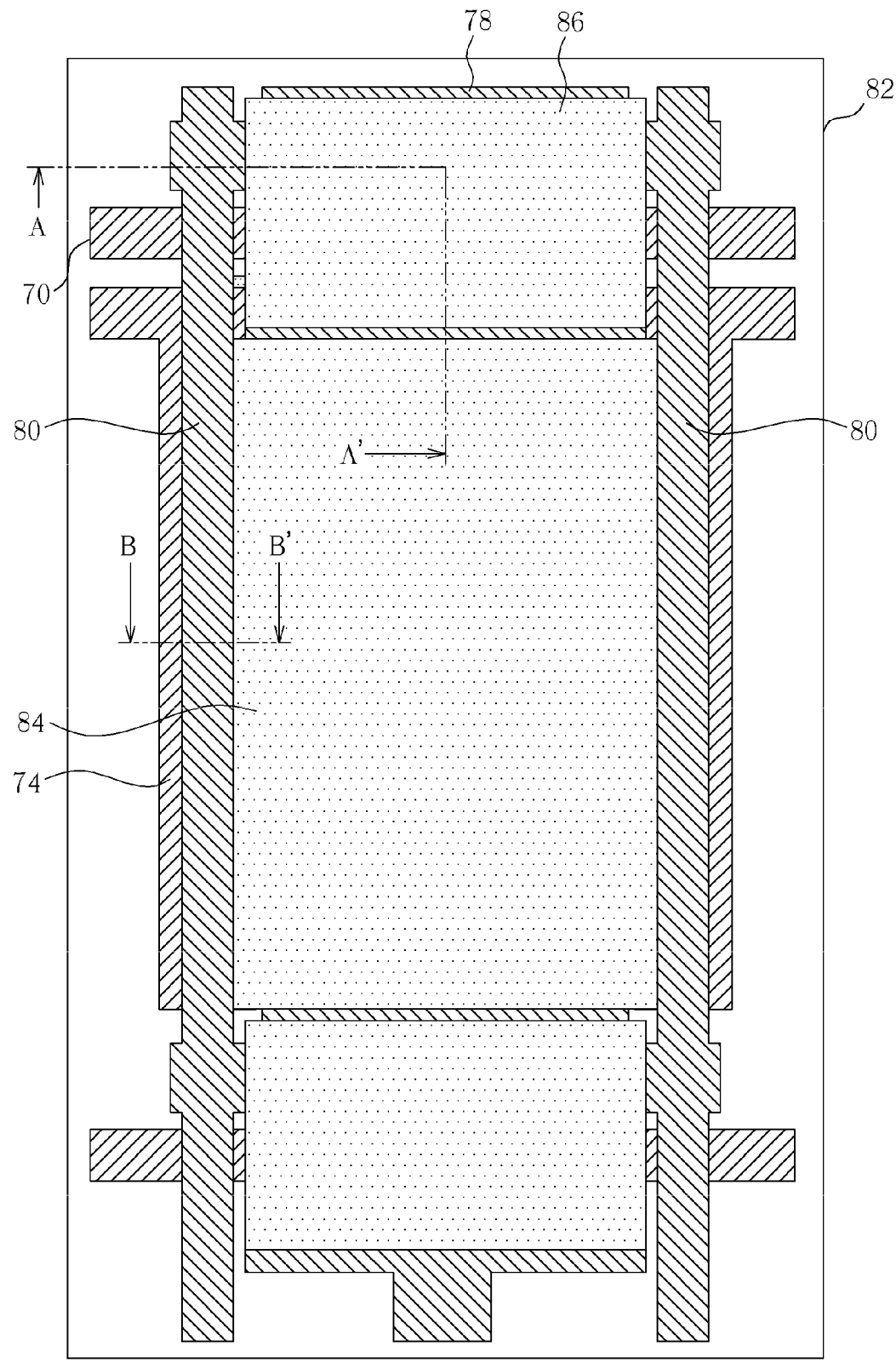
FIG. 18 is a top view of a transflective LCD panel according to another embodiment of the present invention.
Figure 19:
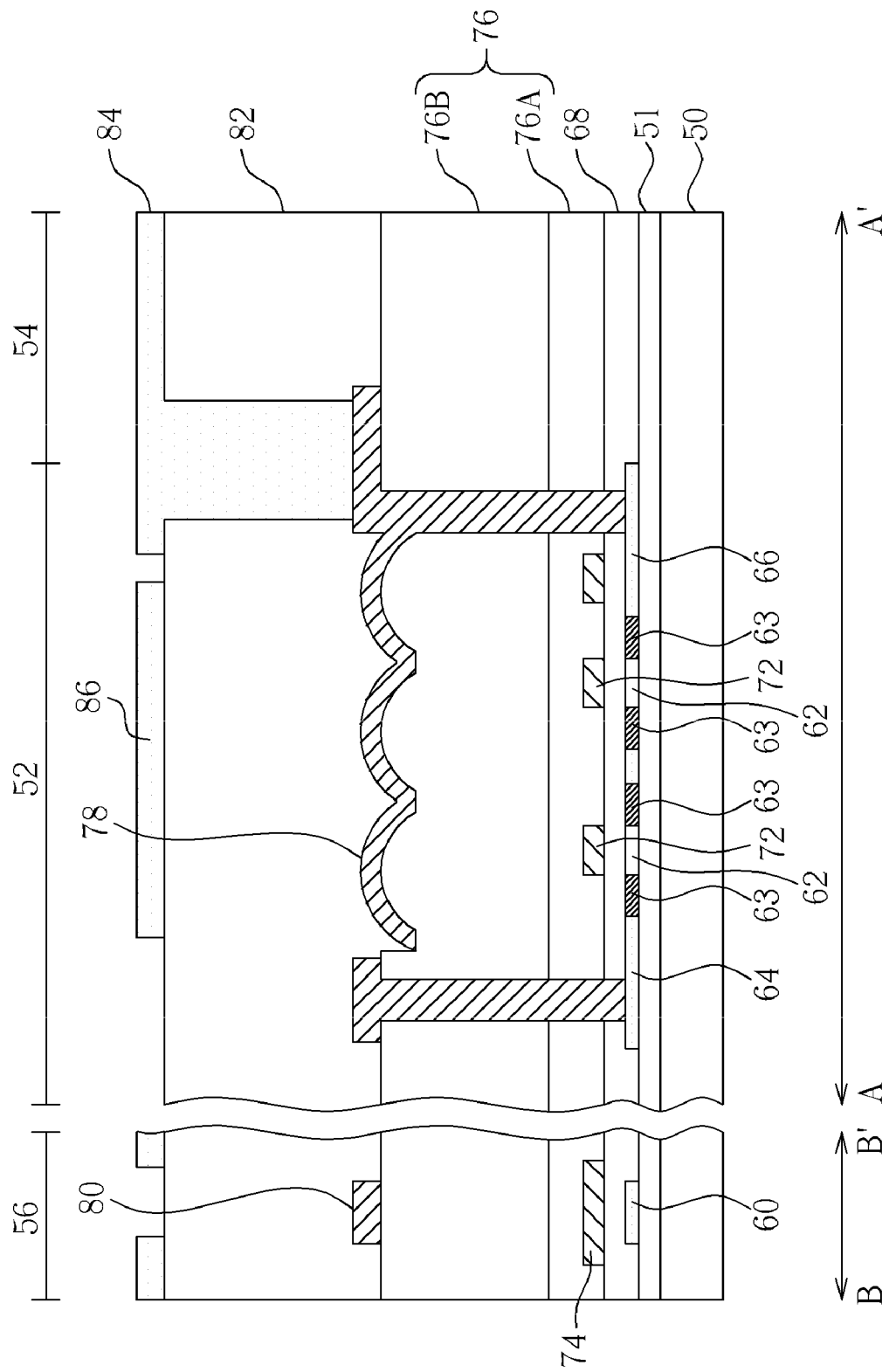
FIG. 19 is a cross-sectional view of the transflective LCD panel shown in FIG. 18.
Figure 20:
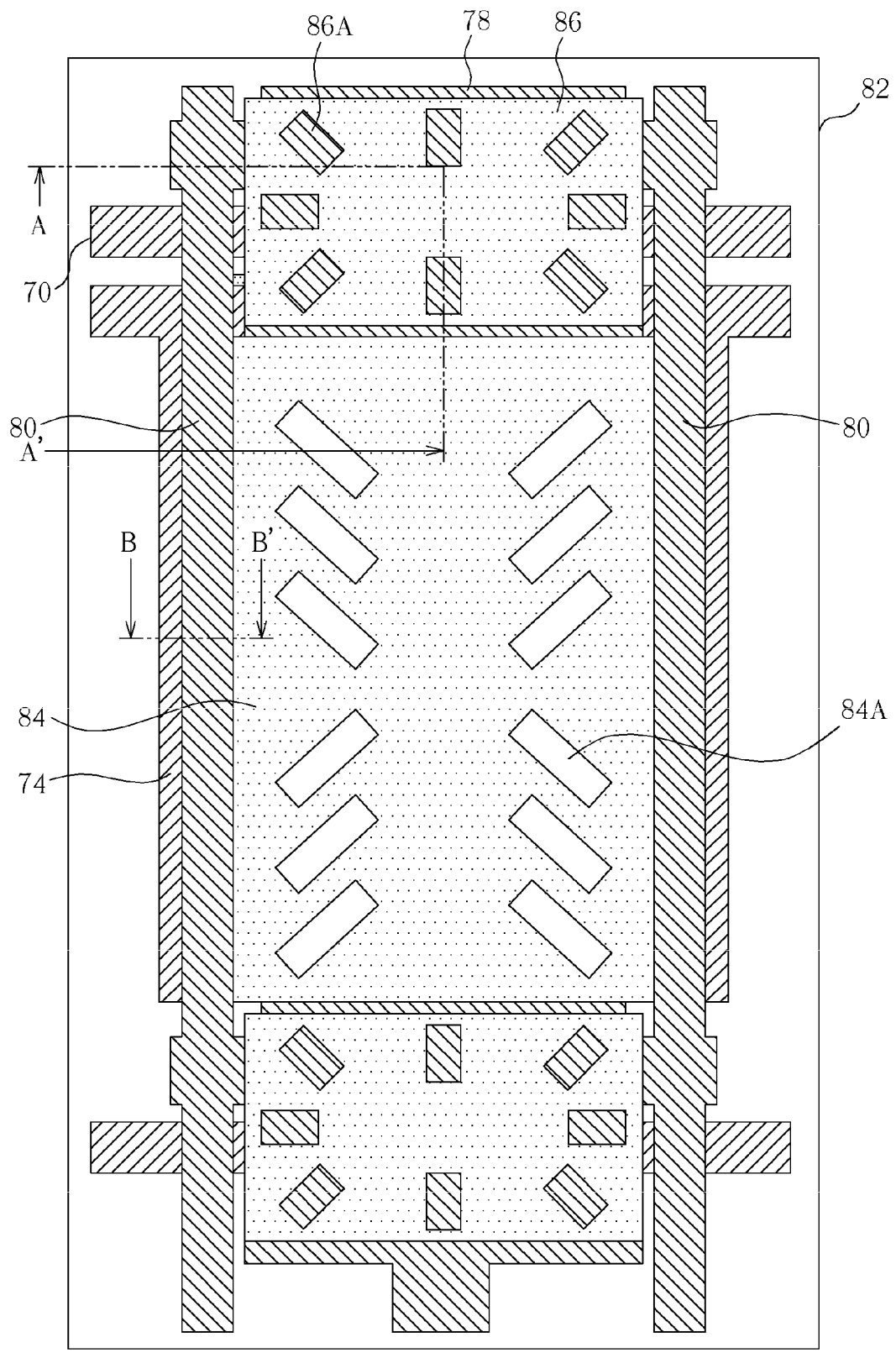
FIG. 20 is a top view of a transflective LCD panel according to still another embodiment of the present invention.
Figure 21:
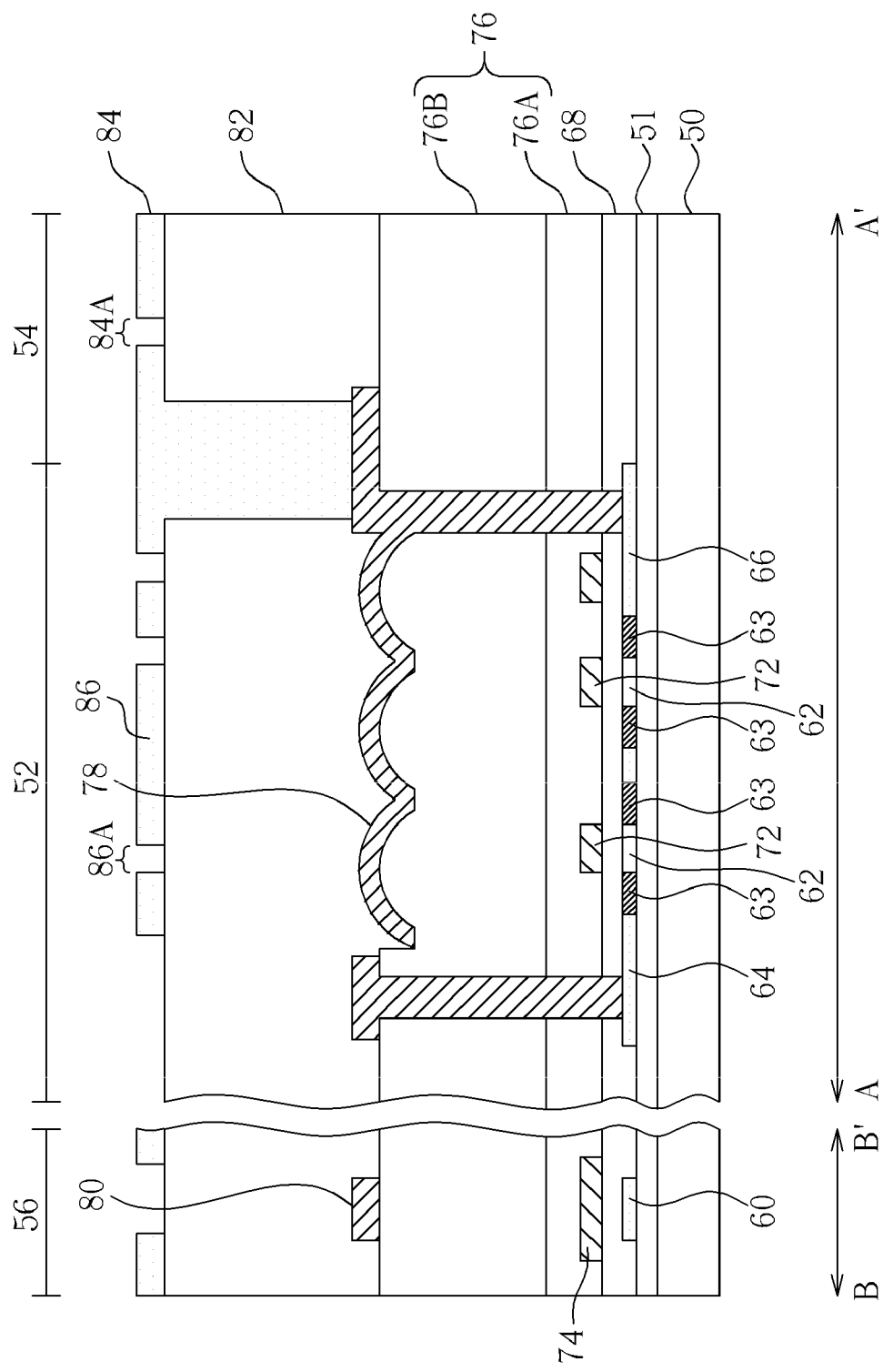
FIG. 21 is a cross-sectional view of the transflective LCD panel shown in FIG. 20.

The transflective LCD panel is not limited by the aforementioned embodiment, and may have other variations. Please refer to FIGS. 18-21. FIG. 18 is a top view of a transflective LCD panel according to another embodiment of the present invention, and FIG. 19 is a cross-sectional view of the transflective LCD panel shown in FIG. 18. FIG. 20 is a top view of a transflective LCD panel according to still another embodiment of the present invention, and FIG. 21 is a cross-sectional view of the transflective LCD panel shown in FIG. 20. In order to compare the difference between these embodiments, identical components are denoted by identical numerals, and are not redundantly repeated.

As shown in FIGS. 18 and 19, the transflective LCD panel of this embodiment includes a floating transparent conductive pattern 86 disposed on the surface of the second inter-layer dielectric layer 82 in the reflection region 52. The transparent conductive pattern 86 and the transmission electrode 84 are made of the same transparent conductive layer patterned in the seventh photolithographic process, and thus no extra photolithographic process is required to form the transparent conductive pattern 86. The transparent conductive pattern 86, which is electrically disconnected to the transmission electrode 84, is used to equalize the surface property between the reflection region 52 and the transmission region 54. For example, the transparent conductive pattern 86 makes the reflection region 52 and the transmission region 54 have the same height, so as to facilitate the step of rubbing alignment pattern to be formed successively.

As shown in FIGS. 20 and 21, the transmission electrode 84 of the transflective LCD panel in this embodiment includes a plurality of slit openings 84A, and the transparent conductive pattern 86 may selectively include a plurality of slit openings 86A. The slit openings 84A of the transmission electrode 84 and the slit openings 86A of the transparent conductive pattern 86 may be formed simultaneously in the seventh photolithographic process without requiring extra process. The slit openings 84A of the transmission electrode 84 and the slit openings 86A of the transparent conductive pattern 86 are able to make liquid crystal molecules align along different directions (multi-domain alignment), and are used in wide viewing angle LCD panel.

Figure 22:
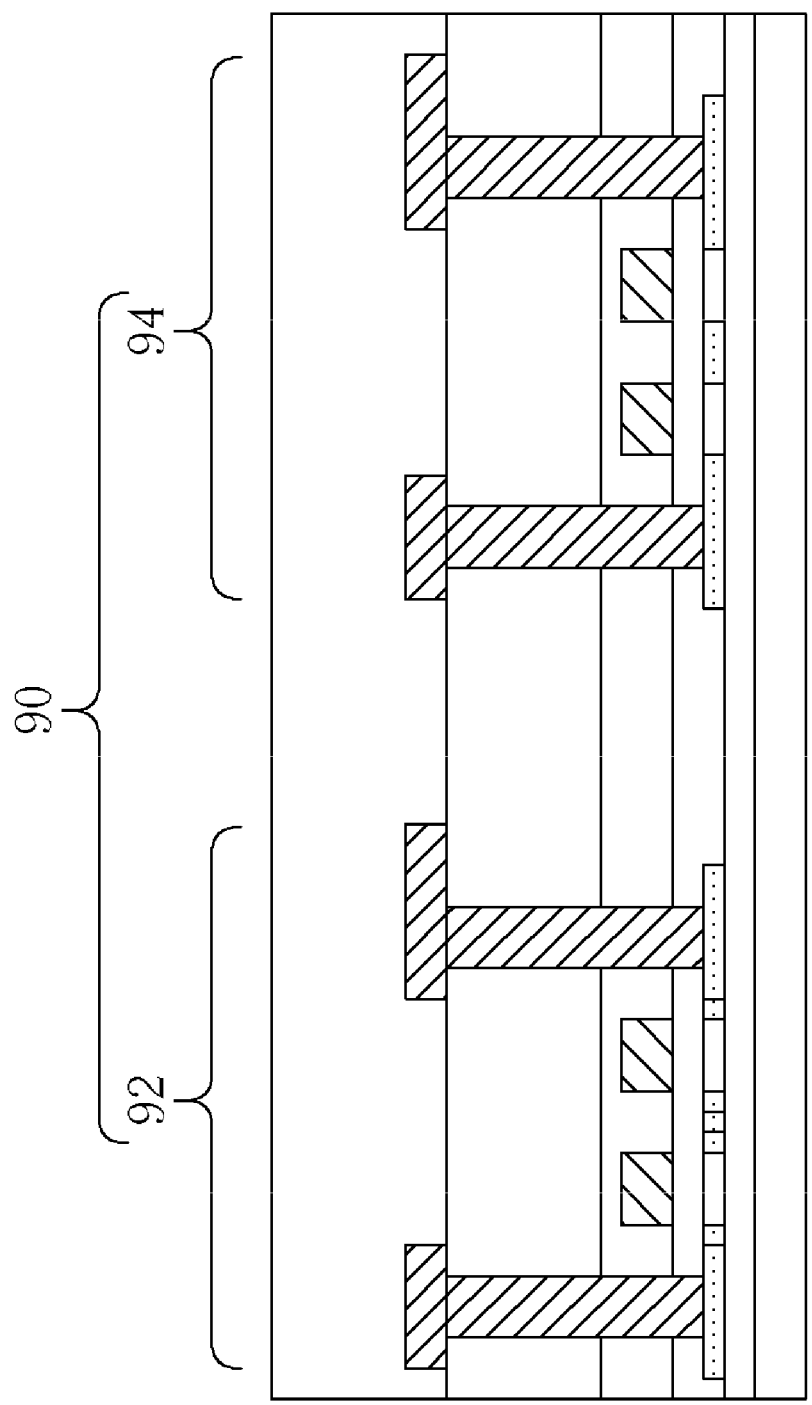
FIG. 22 schematically illustrates a peripheral circuit region of the present invention.

Please refer to FIG. 22. FIG. 22 schematically illustrates a peripheral circuit region of the present invention. As shown in FIG. 22, the fabrication of the control device in the peripheral circuit region and the fabrication of the TFT in the pixel region may be integrated. In this embodiment, the control device includes a CMOS transistor 90 composed of an NMOS transistor 92 and a PMOS transistor 94, but not limited. For instance, the control device may include a single NMOS transistor or a single PMOS transistor.

In conclusion, the method of the present invention simplifies process steps, and therefore only requires seven photolithographic processes to from a transflective LCD panel with single cell gap design. In addition, the first inter-layer dielectric layer includes an inorganic dielectric layer and an organic dielectric layer, and this composite inter-layer dielectric layer reduces the coupling between the first metal layer and the second metal layer. Consequently, parasitic capacitance is minimized. Also, the photosensitive organic dielectric layer can be patterned by exposing and developing without requiring etching. Furthermore, the reflection electrode is disposed over the TFT instead of in the capacitor region, which increases the area of the reflection region. Also, the aperture ratio is improved since the storage capacitor is formed beneath the data line.

Those skilled in the art will readily observe that numerous modifications and alterations of the device and method may be made while retaining the teachings of the invention.

What is claimed is:

1. A transflective liquid crystal display panel, comprising:
a substrate comprising a reflection region, a transmission region and a peripheral region;
a polycrystalline silicon layer disposed on the substrate, the polycrystalline silicon layer comprising a first polycrystalline silicon pattern disposed in the reflection region, and a second polycrystalline silicon pattern disposed in the peripheral region, wherein the first polycrystalline silicon pattern comprises a channel, and a source electrode and a drain electrode respectively disposed on two opposite sides of the channel;
an insulating layer disposed on the polycrystalline silicon layer and the substrate;
a first metal layer disposed on the insulating layer, the first metal layer comprising a gate electrode corresponding to the channel, a storage capacitor line corresponding to the second polycrystalline silicon pattern, wherein the second polycrystalline silicon pattern, the storage capacitor line, and the insulating layer disposed therebetween form a storage capacitor;
a first inter-layer dielectric layer disposed on the insulating layer and the first metal layer, the first inter-layer dielectric layer having two openings exposing the source electrode and the drain electrode respectively;
a second metal layer disposed on the first inter-layer dielectric layer, the second metal layer comprising a reflection electrode and a data line, wherein the reflection electrode is disposed in the reflection region and electrically connected to the drain electrode via the opening of the first inter-layer dielectric layer corresponding to the drain electrode, the data line is disposed in the peripheral region, extended to the reflection region, and electrically connected to the source electrode via the opening of the first inter-layer dielectric layer corresponding to the source electrode;
a second inter-layer dielectric layer disposed on the first inter-layer dielectric layer and the second metal layer, the second inter-layer dielectric layer having an opening partially exposing the second metal layer; and
a transmission electrode disposed on the second inter-layer dielectric layer, wherein the transmission electrode is disposed in the transmission region, extended to a border region between the reflection region and the transmission region, and electrically connected to the drain electrode via the opening of the second inter-layer dielectric layer.

2. The transflective liquid crystal display panel of claim 1, wherein the first inter-layer dielectric layer comprises an inorganic dielectric layer or a photosensitive organic dielectric layer.

3. The transflective liquid crystal display panel of claim 1, wherein the second inter-layer dielectric layer comprises a photosensitive organic dielectric layer.

4. The transflective liquid crystal display panel of claim 1, wherein the first inter-layer dielectric layer comprises a rough surface in the reflection region, and the reflection electrode disposed on the first inter-layer dielectric layer accordingly comprises a rough surface.

5. The transflective liquid crystal display panel of claim 1, wherein the transmission electrode further comprises a transparent conductive pattern, the transparent conductive pattern is floating, and disposed on a surface of second inter-layer dielectric layer in the reflection region.

6. The transflective liquid crystal display panel of claim 5, wherein the transparent conductive pattern comprises a plurality of slit openings.

7. The transflective liquid crystal display panel of claim 1, wherein the transmission electrode comprises a plurality of slit openings.

8. The transflective liquid crystal display panel of claim 1, wherein the transmission electrode and the data line are not overlapping, or an edge of the transmission electrode and an edge of the data line are aligned.

9. The transflective liquid crystal display panel of claim 1, further comprising a buffer layer disposed between the substrate and the polycrystalline silicon layer.

* * * * *